United States Patent
Wang et al.

(10) Patent No.: US 10,930,840 B2
(45) Date of Patent: Feb. 23, 2021

(54) EXCHANGE-COUPLED COMPOSITES

(71) Applicant: Seagate Technology LLC, Cupertino, CA (US)

(72) Inventors: Cheng Wang, Los Gatos, CA (US); Pin-Wei Huang, Fremont, CA (US); Ganping Ju, Pleasanton, CA (US); Kuo-Hsing Hwang, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/255,698

(22) Filed: Jan. 23, 2019

(65) Prior Publication Data
US 2019/0229260 A1 Jul. 25, 2019

Related U.S. Application Data

(60) Provisional application No. 62/620,975, filed on Jan. 23, 2018.

(51) Int. Cl.
| | |
|---|---|
| *H01L 43/02* | (2006.01) |
| *H01L 43/10* | (2006.01) |
| *H01L 27/22* | (2006.01) |
| *H01L 43/08* | (2006.01) |

(52) U.S. Cl.
CPC ............ *H01L 43/10* (2013.01); *H01L 27/222* (2013.01); *H01L 27/224* (2013.01); *H01L 43/02* (2013.01); *H01L 43/08* (2013.01)

(58) Field of Classification Search
CPC ..... H01L 27/222; H01L 27/224; H01L 43/02; H01L 43/08; H01L 43/10; H01L 43/12
See application file for complete search history.

(56) References Cited

U.S. PATENT DOCUMENTS

| | | | |
|---|---|---|---|
| 8,076,013 B2 | 12/2011 | Sonobe et al. | |
| 8,330,240 B2* | 12/2012 | Ranjan | G11C 11/5607 257/421 |
| 8,742,518 B2 | 6/2014 | Wang et al. | |
| 9,515,257 B2* | 12/2016 | Hersam | H01L 27/2463 |
| 2005/0111144 A1* | 5/2005 | Sbiaa | B82Y 10/00 360/324.2 |
| 2010/0109656 A1 | 5/2010 | Wang et al. | |
| 2012/0026776 A1* | 2/2012 | Yang | G11C 13/0002 365/148 |
| 2012/0039115 A1* | 2/2012 | Zheng | B82Y 10/00 365/158 |
| 2012/0212998 A1 | 8/2012 | Ranjan et al. | |
| 2013/0026434 A1* | 1/2013 | Yang | H01L 27/2472 257/1 |
| 2016/0012863 A1* | 1/2016 | Kikitsu | G11B 5/746 369/13.26 |
| 2018/0226115 A1 | 8/2018 | Sonoda et al. | |

\* cited by examiner

*Primary Examiner* — Stephen W Smoot
(74) *Attorney, Agent, or Firm* — Mueting Raasch Group

(57) ABSTRACT

A memristor may include an exchange-coupled composite (ECC) portion to provide three or more nonvolatile magneto-resistive states. The ECC portion may include a continuous layer and a granular layer magnetically exchange coupled to the continuous layer. A plurality of memristors may be used in a system to, for example, define a neural network.

16 Claims, 8 Drawing Sheets

EXCHANGE-COUPLED COMPOSITES

This application claims the benefit of U.S. Provisional Patent Application No. 62/620,975, filed Jan. 23, 2018, which is incorporated by reference in its entirety.

The present disclosure relates to exchange-coupled composites, e.g., for use in memristors.

SUMMARY

One illustrative embodiment of a memristor may include a magnetically-fixed portion and an exchange-coupled composite (ECC) portion to provide three or more nonvolatile magneto-resistive states. The ECC portion may include a continuous layer and a granular layer magnetically exchange coupled to the continuous layer.

One illustrative device may include a continuous layer and a granular layer magnetically exchange coupled to the continuous layer. The distribution of switching energy barrier in the granular layer may provide three or more nonvolatile magneto resistive states when used in conjunction with a magnetically-fixed portion.

One illustrative system may include a plurality of nodes and a plurality of memristors. Each memristor may be operably coupling one node to another node, and each memristor may include an exchange-coupled composite (ECC) portion to provide three or more nonvolatile magneto-resistive states. The ECC portion may include a continuous layer and a granular layer magnetically exchange coupled to the continuous layer.

The above summary is not intended to describe each embodiment or every implementation of the present disclosure. Advantages, together with a more complete understanding, will become apparent and appreciated by referring to the following detailed description and claims taken in conjunction with the accompanying drawings.

Figure 1:
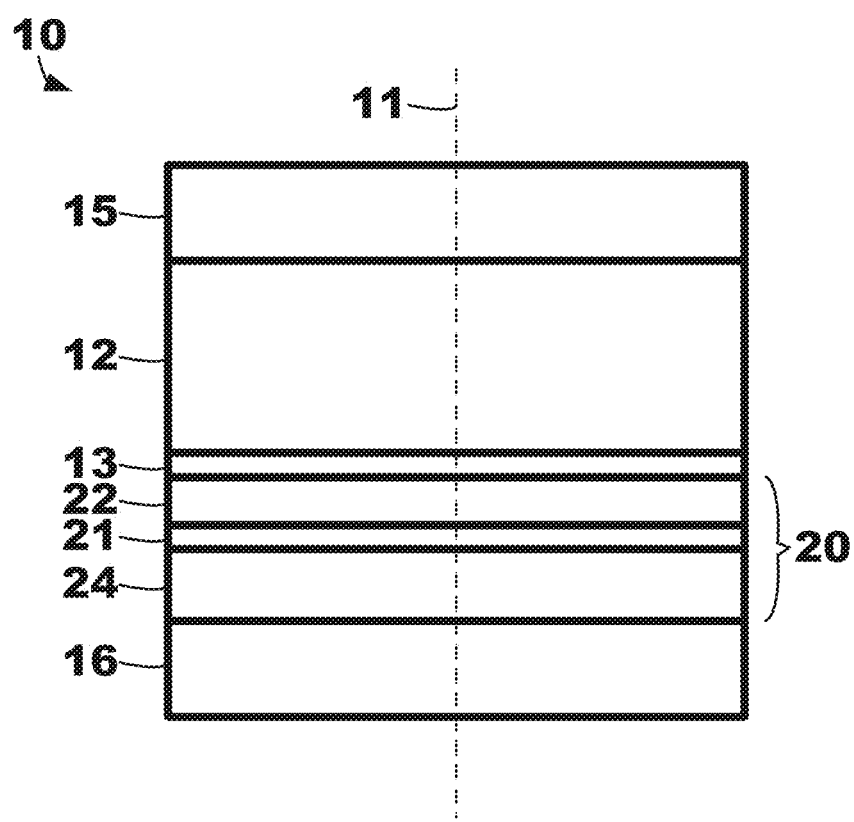
FIG. 1 is cross-section of an illustrative memristor device.

The figures are rendered primarily for clarity and, as a result, are not necessarily drawn to scale.

DETAILED DESCRIPTION OF EXEMPLARY EMBODIMENTS

Illustrative devices, apparatus, structures, systems, and methods shall be described with reference to FIGS. 1-8. It will be apparent to one skilled in the art that elements or processes from one embodiment may be used in combination with elements or processes of the other embodiments, and that the possible embodiments of such devices, apparatus, structures, systems, and methods using combinations of features set forth herein is not limited to the specific embodiments shown in the figures and/or described herein. Further, it will be recognized that the embodiments described herein may include many elements that are not necessarily shown to scale. Still further, it will be recognized that timing of the processes and the size and shape of various elements herein may be modified but still fall within the scope of the present disclosure, although certain timings, one or more shapes and/or sizes, or types of elements, may be advantageous over others.

Deep learning may be based on architectures of deep artificial neural networks. In such neural networks and algorithms associated therewith, layers of computing arrays may be stacked and connected resembling interconnected neurons in human brains. Computation with such computing arrays may be executed using matrix operations such as addition and multiplication together with certain non-linear activation functions. Computing architecture for deep learning may use central processing units (CPU) plus graphical processing units (GPU) as computing units together with separate memory units (e.g., dynamic random-access memory, static random-access memory etc.) for cache during computation. Such systems may be in frequent communications of data between the computing units and memory units when running neural network programs. Moreover, cache memory is often volatile thereby requiring constant power for refreshing and updating, and thus, the power consumption under such architecture may be large and less efficient compared to the human brain. The large power consumption, among other things, may limit wide adoption of deep learning computing and artificial intelligence in general particularly on edge devices/applications.

One pathway to lowering the energy consumption of deep learning may be neuromorphic computing or brain-inspired computing. Brain-inspired computing may be described as mimicking the brain's computing paradigm from the foundation level and aims for improvement of computing efficiency. In order to achieve high performance brain-inspired computing, building blocks such as "neurons" and "synapses" may be realized using electronic devices and circuits. A neuron is a computing unit with activation functions may take input signals from multiple connects ("synapses"). The synapses, or connects, may define tunable values (known as "weights") to represent the adjustable relationships of the interconnected neurons across each synapse. In order to have optimal power efficiency, the synapses would be non-volatile. Thus, there is a longstanding need realized in brain-inspired computing, among other computing fields, is to find robust, mature and scalable components to mimic the brain's functional neurons and synapses.

Memristors, a concatenation of "memory resistors," by definition, are a type of passive circuit element that maintain a relationship between the time integrals of current and voltage across a two-terminal element. Therefore, a memristor's resistance varies with the applied voltage or current, and the resistance is non-volatile since the device has hysteresis (e.g., the history of the applied voltage or current can be maintained). Memristors may be used in brain-inspired computing because the neurons and synapses in brain-inspired computing may be optimal when having non-volatility and also having multiple tunable electronic states (analog, or more than two stats, as opposed to digital that has just two states), both properties which can be met by memristors.

Different kinds of memristor prototypes may be based on a variety of physical mechanisms. For example, resistive random-access memory (e.g., a $TiO_2$-based ionic bridge), magneto-resistive random-access memory (MRAM) (e.g., using domain-wall movement), and phase-change random-access memory (e.g., using a crystalline-amorphous phase) may be potentially used for memristors. For example, MRAIVI may be used for a memristor because it has a simple structure, high endurance, and lower power.

In physics terminology, energy barrier and non-volatility may be described as "two sides of the same coin." For example, one needs to write information by overcoming the energy barrier; however, the energy barrier also characterizes how "good" the information can be retained. This is known as write-ability versus stability dilemma. MRAM may have the versatility of various designs of magnetic structure for overcoming the dilemma.

One of the remaining challenges for making magnetic tunnel junction-based memristor is to realize the analog function in a single cell, that is, instead of the two states ("0" and "1") in a memory device, a plurality of states can be read from and written into one cell.

The present disclosure describes, among other things, illustrative devices, apparatus, and structures of magnetic multilayer system to achieve an analog function. In particular, for example, illustrative devices, apparatus, and structures may be described as implementing an exchange coupled composite (ECC) free layer into a magnetic tunnel junction arrangement to, e.g., minimize the writing current while still providing magnetic states (e.g., more than two states to as to provide the analog function) with good thermal stability.

The present disclosure may be generally described as being about magnetic non-volatile, multi-level memory devices, apparatus, and structures. Further, illustrative systems may utilize such devices, apparatus, and structures by integrating arrays of such devices, apparatus, and structures into brain-inspired chips for applications in artificial intelligence. Further, it may be described that the present disclosure addresses methods of realizing analog non-volatile memory based on magnetic multilayer, thin-film devices, apparatus, and structures.

It may be described that the illustrative devices, apparatus, and structures described herein may be designed for or useful in implementing memristive chips based on magnetism. The illustrative devices, apparatus, and structures may be described as include magnetic thin-film multilayers such as magnetic tunnel junctions (MTJ) or giant-magnetoresistance spin valves. The free layer, or free layer block, of the illustrative devices, apparatus, and structures may be described as having a composite structure, which is composed of a granular layer magnetically coupled with a continuous layer. A barrier layer may be in contact with the continuous part of the free layer.

A writing operation may involve switching due to the spin transfer torque effect under injection of electrical current or due to applied magnetic field, and the reading operation may be based on magnetoresistance. In one or more embodiments, the magnetic grains in the granular layer may have a distribution of switching energy barrier, and thus, can be switched under different current densities resulting in a plurality of resistance states in the device. The multiple resistive states may also be non-volatile and discrete so as to provide a memristor, which may be useful for implementing brain-inspired computing such as neuromorphic computing or deep neural network computing.

In at least one embodiment, the illustrative devices, apparatus, and structures may be described as including a perpendicular magnetic tunnel junction (MTJ) like the memory cells in spin-transfer torque (STT) MRAM but the "free layer" part, portion, is not the same. Instead, the free layer in the illustrative devices, apparatus, and structures may be a bi-layer system of an exchange coupled composite (ECC).

An illustrative memristor device 10 is depicted in FIG. 1. The memristor device 10 includes a fixed, or reference, layer 12, a barrier layer 13, and an exchanged-coupled composite (ECC) portion 20. As will be described further herein, the ECC portion 20 may be configured to provide three or more magneto-resistance states, for example, so as to provide, or achieve, the analog functionality of the memristor device 10.

It is to be understood that portions and layers of the memristor device 10 may be made, or formed, using any deposition process that may be capable of making such portions and layers. In one or more embodiments, various etching processes may be used to form each layer or portion of the device 10. For example, reactive-etching process including gases such as carbon monoxide (CO), ammonia ($NH_3$), and/or chlorine ($Cl_2$) may be utilized. Further, for example, ion-beam etching may be utilized.

Further, a first electrode 15 may be electrically and physically coupled to the magnetically-fixed portion 12 and a second electrode 16 may be electrically and physically coupled to the ECC portion 20. Each of the first and second electrodes 15, 16 may include a plurality of different materials that are useful as electrically conductive materials. Generally, the electrodes 15, 16 may include conductive materials and may be configured to provide electrical connection to the device 10. In one embodiment, the electrodes 15, 16 may include (e.g., be formed of) tantalum. In one or more embodiments, the electrodes 15, 16 may include (e.g., be formed of) one or more of the following materials: tantalum; gold; tungsten; copper; platinum; ruthenium; chromium; and alloys of any of the preceding metals. In one embodiment, each of the electrodes 15, 16 may define a thickness of about 5 nanometers (nm) to about 20 nm.

The electrodes 15, 16 may be described as electrically connecting the magnetically-fixed portion 12 and the ECC portion 20 to a control circuit providing read and write currents through the magnetically-fixed portion 12 and ECC portion 20. The resistance across the device 10 is determined by the relative orientation of the magnetization vectors or magnetization orientations of the magnetically-fixed portion 12 and the ECC portion 20. As described further herein, the magnetization direction of the magnetically-fixed portion 12 is pinned in a predetermined, or selected, perpendicular magnetization direction (e.g., perpendicular magnetic anisotropy, parallel to the axis 11 but perpendicular to the layers of the device 10) while the perpendicular magnetization direction of the ECC portion 20 is free to rotate under the influence of a magnetic field or spin transfer torque. Pinning of the magnetically-fixed portion 12 may be achieved through, e.g., the use of exchange bias with an antiferromagnetically ordered material such as platinum manganese, iridium manganese and others.

The ECC portion 20 may include a continuous layer 22 that, in some embodiments, may be a continuous metallic, ferromagnetic thin film. The continuous layer 22 may be described as being continuous because the continuous layer 22 is a uniform layer (e.g., uniform in thickness, uniform in composition, etc.). Further, the continuous layer 22 may be described as being continuous because the continuous layer 22 may not have been patterned during deposition processes. In other words, no structures were created in the continuous layer 22 using etching processes.

The ECC portion 20 may also include a granular layer 24 that, in some embodiments may be described as a granular, thin film where ferromagnetic grains are deposited in columnar structure segregated by oxides. The continuous layer 22 may be responsible for generating a tunneling magnetoresistance (TMR) signal when its magnetic state varies. The granular, or granular composite, layer 24 may include metallic ferromagnetic grains segregated by insulating non-magnetic oxides that are responsible for analog bit storage. Those magnetic grains of the granular layer 24 may have a distribution of switching energy barrier that can be tuned by deposition processes and adjustment of the alloy compositions. Further, such grains of the granular layer 24 may have high anisotropy (Ku) in order to individually hold stable against thermal agitations at room or working temperatures. Further, in the ECC portion 20, the magnetic moments from the two layers are exchange coupled, meaning that the magnetic moments in the continuous layer 22 can be aligned or controlled by the magnetic moments underneath in the granular layer 24 and the granular layer 24 can be aligned or controlled by the magnetic moments underneath in the continuous layer 22.

The continuous layer 22 may include a plurality of different materials. In one embodiment, the continuous layer 22 may include (e.g., be formed of) cobalt iron boron. In other embodiments, the continuous layer 22 may include (e.g., be formed of) one or more of the following materials: cobalt iron boron; iron boron; cobalt iron; iron palladium; and iron.

In one embodiment, the continuous layer 22 may define a thickness of about 1 to about 2 nm. Further, the continuous layer 22 may define a thickness greater than or equal to about 0.2 nm, greater than or equal to about 0.5 nm, greater than or equal to about 1 nm, greater than or equal to about 1.5 nm, greater than or equal to about 2 nm, etc. Still further, the continuous layer 22 may define a thickness less than or equal to about 6 nm, less than or equal to about 5.5 nm, less than or equal to about 5 nm, less than or equal to about 4 nm, less than or equal to about 3.5 nm, less than or equal to about 3 nm, etc.

The granular layer 24 may include grains of plurality of different materials and insulative material between the grains. The granular layer 24 may include grains of (e.g., be formed of) one or more of the following materials: cobalt platinum; iron platinum; and iron palladium. Further, the grains of the granular layer 24 may further include (e.g., be formed of) one or more of the following materials: cobalt; iron; and nickel. Still, the grains of the granular layer 24 may further include (e.g., be formed of) one or more of the following oxide materials: titanium oxide ($TiO_2$); silicon oxide ($SiO_2$); boron oxide; chromium oxide; and tungsten oxide.

The grains of material of the granular layer 24 may define an average grain size, or diameter, between about 5 nm and about 10 nm. In one embodiment, the grains of material of the granular layer 24 may define an average grain size, or diameter, of about 7 nm. Further, the grains of material of the granular layer 24 may define an average grain size, or diameter, greater than or equal to about 2 nm, greater than or equal to about 3 nm, greater than or equal to about 4 nm, greater than or equal to about 5 nm, greater than or equal to about 6 nm, etc. Still further, the grains of material of the granular layer 24 may define an average grain size, or diameter, less than or equal to about 15 nm, less than or equal to about 12 nm, less than or equal to about 10 nm, less than or equal to about 9 nm, less than or equal to about 8 nm, etc.

In one embodiment, the granular layer 24 may define a thickness of less than or equal to about 5 nm. In one embodiment, the granular layer 24 may define a thickness of about 7 nm. Further, the granular layer 24 may define a thickness greater than or equal to about 0.5 nm, greater than or equal to about 0.8 nm, greater than or equal to about 1 nm, greater than or equal to about 1.5 nm, greater than or equal to about 2 nm, etc. Still further, the granular layer 24 may define a thickness less than or equal to about 15 nm, less than or equal to about 12 nm, less than or equal to about 11 nm, less than or equal to about 10 nm, less than or equal to about 9 nm, less than or equal to about 8 nm, etc.

As described, the granular layer 24 may further include an insulating material, and the grains of the granular layer 24 may be separated by the insulating material. The insulating material may include (e.g., be formed of) insulating metallic, nonmagnetic oxides or nonmetallic, nonmagnetic oxides. In one embodiment, the insulating material may be chromium oxide ($Cr_2O_3$). In other embodiments, the insulating material may include (e.g., be formed of) one or more of the following materials: titanium oxide ($TiO_2$); silicon oxide ($SiO_2$); tantalum oxide ($Ta_2O_5$); tungsten oxide (WO); aluminum oxide ($Al_2O_3$); tantalum nitride (TaN); titanium nitride (TiN); boron nitride (BN); and boron oxide ($B_2O_3$).

The granular layer 24 may define an anisotropy between about 0.2 Merg/cc and about 20 Merg/cc. In one embodiment, the anisotropy of the granular layer 24 is between 0.5 Merg/cc and about 10 Merg/cc. In one or more embodiments, the anisotropy of the granular layer 24 may be greater than or equal to about 0.3 Merg/cc, greater than or equal to about 0.4 Merg/cc, greater than or equal to about 0.5 Merg/cc, greater than or equal to about 1 Merg/cc, greater than or equal to about 2 Merg/cc, etc. Further, the anisotropy of the granular layer 24 may be less than or equal to about 20 Merg/cc, less than or equal to about 15 Merg/cc, less than or equal to about 12 Merg/cc, less than or equal to about 10 Merg/cc, less than or equal to about 7 Merg/cc, less than or equal to about 5 Merg/cc, etc.

The granular layer 24 may define a magnetic saturation moment between about 250 emu/cc and about 3000 emu/cc. In one embodiment, the magnetic saturation moment of the granular layer 24 is between 500 emu/cc and 2000 emu/cc. In one or more embodiments, the magnetic saturation moment of the granular layer 24 may be greater than or equal to about 250 emu/cc, greater than or equal to about 400 emu/cc, greater than or equal to about 500 emu/cc, greater than or equal to about 750 emu/cc, etc. Further, the magnetic saturation moment of the granular layer 24 may be less than or equal to about 3000 emu/cc, less than or equal to about 2500 emu/cc, less than or equal to about 2000 emu/cc, less than or equal to about 1500 emu/cc, less than or equal to about 1250 emu/cc, less than or equal to about 1000 emu/cc, etc.

Further, the ECC portion 20 may optionally include an exchange control layer 21 between the continuous layer 22 and the granular layer 24. In other words, the exchange control layer 21 may be "sandwiched" by the continuous layer 22 and the granular layer 24. The exchange control layer 21 may be configured to tune the coupling strength between the continuous layer 22 and the granular layer 24.

One or more of the composition, thickness and/or deposition conditions of the exchange control layer 21 can be used to control the type of exchange coupling and the amount of exchange coupling between the continuous layer 22 and the granular layer 24, as quantified by the exchange coupling interaction parameter, $h_{ex}$. In some implementations, an exchange control layer 21 is used that facilitates direct ferromagnetic exchange coupling between the continuous layer 22 and the granular layer 24. In these implementations, the exchange control layer 21 can have a thickness of in a range between about 0 nm (i.e., no exchange control layer at 0 nm) to about 30 nm. The exchange control layer 21 may include (e.g., be formed of) one or more of the following magnetic materials: cobalt ruthenium alloy, cobalt ruthenium, cobalt iron; cobalt platinum; iron platinum; cobalt nickel; ruthenium; tantalum; and cobalt chromium ruthenium. Additionally, any of the illustrative magnetic materials of the exchange control layer optically include an oxide such as any one or more of the following oxides, carbides, and/or nitrides: $TiO_2$, $SiO_2$, $Cr_2O_3$, $B_2O_3$, SiC, B, C, BC, TiC, TaC, BN, SiN, TiN, TaN, etc., or any combination thereof. For example, the exchange control layer 21 may include (e.g., be formed of) one or more of the following magnetic materials: magnesium oxide, magnesium oxide copper, titanium oxide ($TiO_4$); aluminum oxide ($Al_2O_3$); magnesium, silver; and copper. In some illustrative embodiments, the exchange control layer 21 may provide antiferromagnetic coupling between the continuous layer 22 and the granular layer 24. In these embodiments, the exchange control layer 21 may include (e.g., be formed of) materials such as ruthenium.

The fixed, or reference, layer 12, may include a plurality of different materials defining or forming one or more layers (e.g., a single layer, a plurality of layers, etc.). In one embodiment, the magnetically-fixed portion 12 may include (e.g., be formed of) cobalt iron boron. In one or more embodiments, the magnetically-fixed portion 12 may include (e.g., be formed of) one or more of the following materials defining or forming one or more layers: cobalt iron boron; tantalum; cobalt platinum; cobalt nickel; cobalt palladium; cobalt; nickel; and ruthenium.

In one embodiment, the magnetically-fixed portion 12 may define a thickness of about 10 nm. Further, the magnetically-fixed portion 12 may define a thickness greater than or equal to about 0.5 nm, greater than or equal to about 1 nm, greater than or equal to about 2 nm, greater than or equal to about 3 nm, greater than or equal to about 4 nm, greater than or equal to about 5 nm, etc. Still further, the magnetically-fixed portion 12 may define a thickness less than or equal to about 30 nm, less than or equal to about 25 nm, less than or equal to about 23 nm, less than or equal to about 20 nm, less than or equal to about 17 nm, less than or equal to about 14 nm, less than or equal to about 12 nm, etc.

The barrier, or tunnel, layer 13 is located between the magnetically-fixed portion 12 and the ECC portion 20. The barrier layer 13, may include a plurality of different materials. In one embodiment, the barrier layer 13 may include (e.g., be formed of) magnesium oxide. In other embodiments, the barrier layer 13 may include (e.g., be formed of) one or more of the following materials: titanium oxide ($TiO_2$); aluminum oxide ($Al_2O_3$); magnesium oxide (MgO); tantalum oxide ($Ta_2O_5$); hafnium oxide ($HfO_2$); zirconium oxide ($ZrO_2$); tantalum nitride (TaN); strontium oxide (SrO); and ruthenium oxide (RuO). In one or more embodiments, the barrier layer 13 may define a thickness greater than or equal to about 0.5 nm, greater than or equal to about 5 nm.

Thus, the device 10 may be described as a plurality of layers from the first electrode 15 being physically and electrically coupled to the magnetically-fixed portion 12, the magnetically-fixed portion 12 being physically coupled to the barrier layer 13, the barrier layer 13 being physically coupled to the continuous layer 22 of the ECC portion 20, the barrier layer 13 positioned between the continuous layer 22 and the magnetically-fixed portion 12 (to, e.g., insulate the continuous layer 22 from the magnetically-fixed portion 12, and insulate the magnetically-fixed portion 12 from the continuous layer 22), the continuous layer 22 being physically and electrically coupled to the exchange control layer 21 (in some embodiments, as the exchange control layer 21 may be optional), the exchange control layer 21 being physically and electrically coupled to the granular layer 24 of the ECC portion 20, and the granular layer 24 being physically and electrically coupled to the second electrode 16. Additionally, as described herein, the continuous layer 22 and the granular layer 24 may be magnetically exchange coupled to each other such that the magnetic moments in the continuous layer 22 can be aligned or controlled by the magnetic moments underneath in the granular layer 24 and the granular layer 24 can be aligned or controlled by the magnetic moments underneath in the continuous layer 22.

Figure 2:
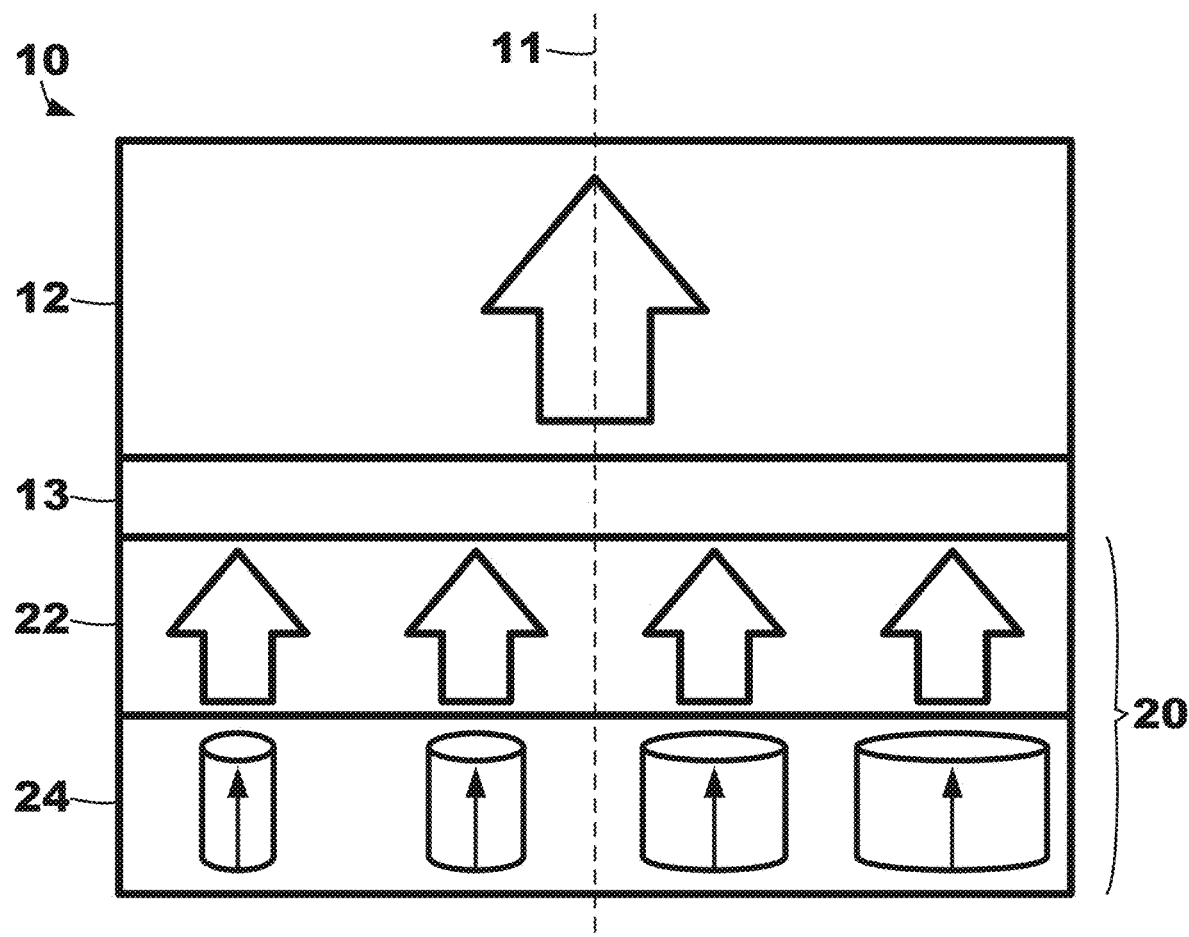
FIG. 2 is a diagrammatic representation of the memristor device of FIG. 1.

The functionality, or mechanism, of realizing analog non-volatile memory based on described illustrative devices, apparatus, and structures is described herein with respect to FIGS. 2-8. A diagrammatic representation of the memristor device 10 of FIG. 1 is depicted in FIG. 2. As shown, each of the magnetically-fixed portion 12, the continuous layer 22 of the ECC portion 20, and the granular layer 24 of the ECC portion 20 include vertical arrows depicted therein. The vertical arrows are representative of the perpendicular magnetic moment within the layer (e.g., perpendicular to the layers of the device 10, parallel to the axis 11). In the diagrammatic representation of FIG. 2, the vertical arrows all point to the top of the page indicating that all perpendicular magnetic moments of the layers 12, 22, 24 are aligned. The direction of the magnetic moment of the magnetically-fixed portion 12 will not change as the magnetically-fixed portion 12 acts as the reference for the ECC portion 20.

The granular layer 24 of FIG. 2 further includes a plurality of grain distributions diagrammatically represented by cylinders of various sizes. Each of the cylinders representing grain distributions represents a range of grain sizes, or diameters, and/or magneto-resistive strengths within the granular layer. The smallest cylinder represents grain distribution having the smallest (e.g., bottom 25%) grains and/or the weakest magneto-resistive strength (e.g., bottom 25%) of the grains of the granular layer 24 and the largest cylinder represents grain distribution having the largest (e.g., top 25%) of the grains and/or the strongest (e.g., top 25%) magneto-resistive strength of the grains of the granular layer 24. Respectively, the middle-left cylinder represents grain distribution having the second smallest (e.g., lower 25%-50% range) grains and/or the second weakest magneto-resistive strength (e.g., lower 25%-50% range) of the grains of the granular layer 24 and the middle-right cylinder represents grain distribution having the second largest (e.g., upper 50%-75% range) grains and/or the second largest magneto-resistive strength (e.g., upper 50%-75% range) of the grains of the granular layer 24.

Figure 3:
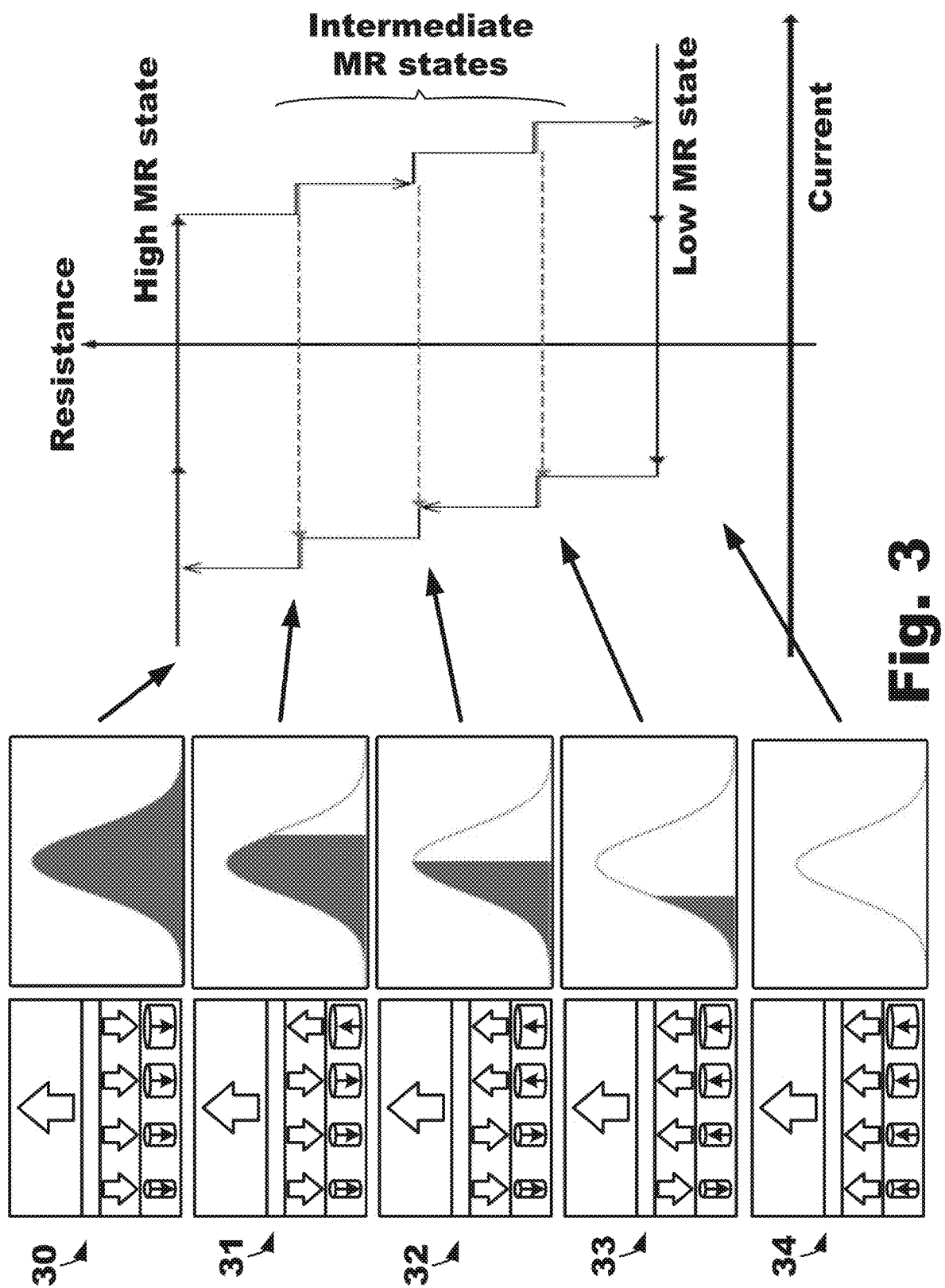
FIG. 3 is diagrammatic representation of a plurality of switching states of the memristor device of FIGS. 1-2.

As will be shown in FIG. 3, some, none, or all of the grain distributions may have the same or opposite magnetic moment as the magnetically-fixed portion 12 depending on the amount of current or voltage applied to the electrodes 15, 16 to store an analog value, which will provide the analog functionality of the memristor device 10. For example, the distribution of switching energy barrier in the granular layer 24 can provide multiple magneto-resistive states in the illustrative devices, apparatus, and structures thereby achieving an analog function as is illustrated in FIG. 3.

A plurality of magneto-resistive states using the illustrative devices, apparatus, and structures are depicted in FIG. 3. More specifically, in this example, five discrete magneto-resistive states 30, 31, 32, 33, 34 are shown following the distribution of switching energy barrier. In other embodiments, the illustrative devices, apparatus, and structures described herein may provide three or more discrete magneto-resistive states such as, e.g., four or more discrete magneto-resistive states, five or more discrete magneto-resistive states, six or more discrete magneto-resistive states, 10 or more discrete magneto-resistive states, etc.

Each of the states 30, 31, 32, 33, 34 includes a diagrammatic representation of the device 10, similar to as depicted in FIG. 2, including vertical arrows indicating an amount of magneto-resistance provided by the ECC portion 20. To the right of the diagrammatic representation of the device 10, each of the states 30, 31, 32, 33, 34 further includes a distribution graph of the grains of granular layer 24 being set, or magnetized, in the opposite direction as the fixed layer 22. Additionally, a magneto-resistive (MR) curve as a function of applied electrical current to illustrative device 10 is depicted to the right of distribution graphs, and arrows are providing linking each of the states 30, 31, 32, 33, 34 to the respective magneto-resistive state on the MR curve. Lastly, it is to be understood that similar plots can be obtained for magnetic field driven switching.

As shown in the first state 30, when the current is increased to a level that 100% of grains can be switched, the resistance also changed by 100% of ΔR, where ΔR is the total resistance change when the granular layer 24 is fully switched, thereby providing a "high" magneto-resistive state. As shown in the second state 31, when the current is increased to a level that 75% of grains can be switched, the resistance also changed by 75% of ΔR, thereby providing the highest "intermediate" magneto-resistive state. As shown in the third state 32, when the current is increased to a level that 50% of grains can be switched, the resistance also changed by 50% of ΔR, thereby providing the second highest "intermediate" magneto-resistive state. As shown in the fourth state 33, when a current that is able to switch the weakest 25% population of the grains is applied, the resistance of the device 10 changed by 25% of ΔR, thereby providing the lowest "intermediate" magneto-resistive state. Also, as shown in the fifth state 34, when no current has been applied or the device has been "erased," the resistance will effectively be 0% of ΔR thereby providing the "low" magneto-resistive state.

The ferromagnetic grains in the granular layer 24 may be configured such that the ferromagnetic grains have a distribution of switching energy barrier (or switching field distribution). More specifically, distribution of switching energy barrier may result from the distributions of anisotropy (Ku), magnetic moment (u), and grain size (V). Therefore, the switching current needed for STT-driven switching of the different grains (or the switching field of those grains) in the granular layer has a certain range of variations. With sufficient exchange coupling between the continuous layer and the granular layer and a sizeable distribution of the grains' switching currents in the granular layer, the magnetic moments in the continuous layer will be progressively switched at different steps following the flipped moments in granular layer during the sweep of the applied current/voltage, and therefore, the magnetoresistance of the illustrative devices, apparatus, and structures, which is determined by the continuous layer at the barrier layer interface (e.g., magnesium oxide), becomes tunable by the applied electrical current/voltage.

Further, the magneto-resistance change will remain after turning off the electrical current/voltage because of the hysteresis of magnetic grains of the granular layer, and therefore, the modified magneto-resistive states can be non-volatile. In order to have non-volatile analog magneto-resistive states, the grains in the exchange coupled composite (ECC) portion hold stable against thermal agitations. In one embodiment, the switching energy (KuV) will be in the order of about 50 kT to about 100 kT.

Figure 4:
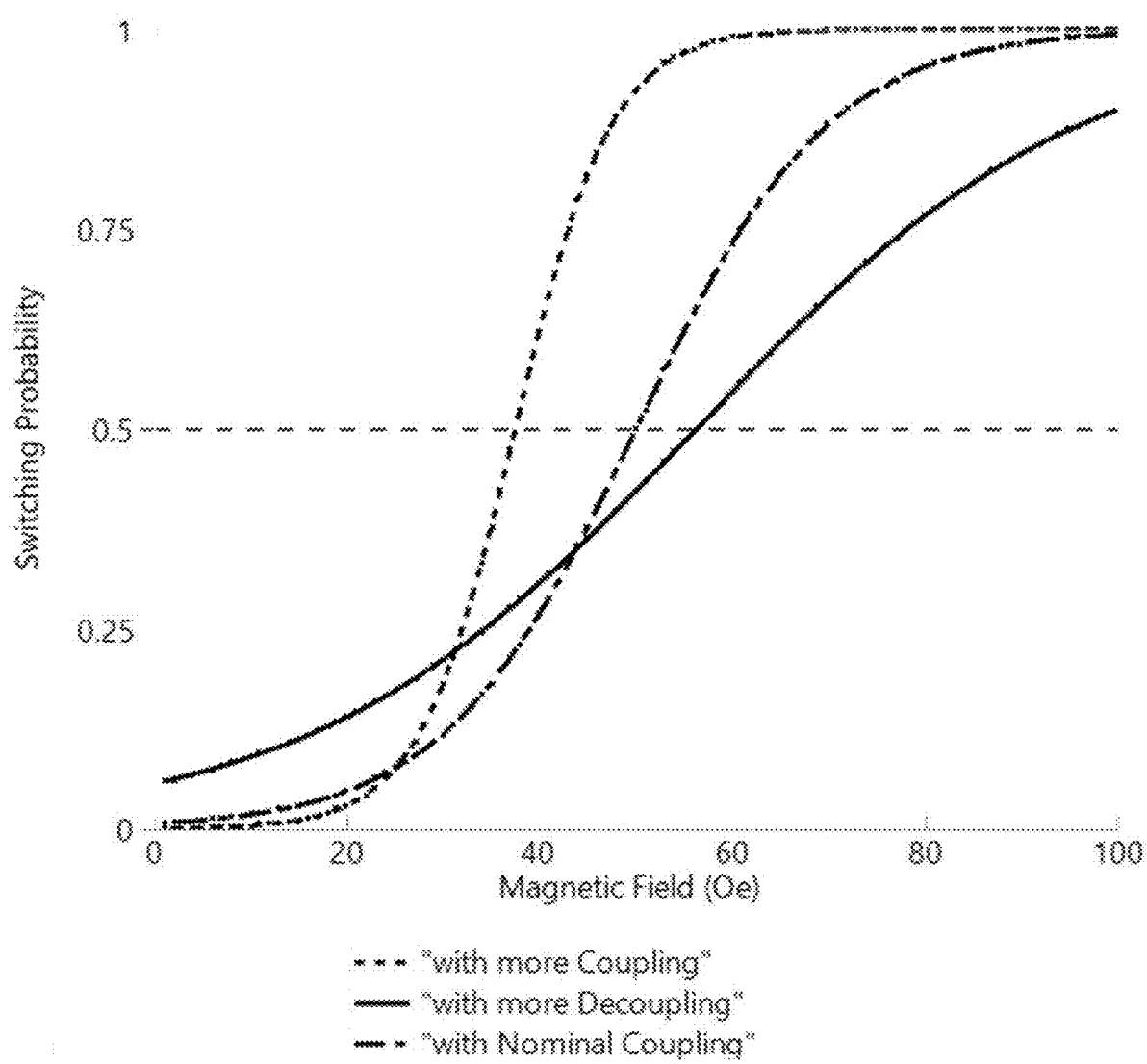
FIG. 4 is a graph of switching probability versus current density for an illustrative exchange coupled composite.
Figure 5:
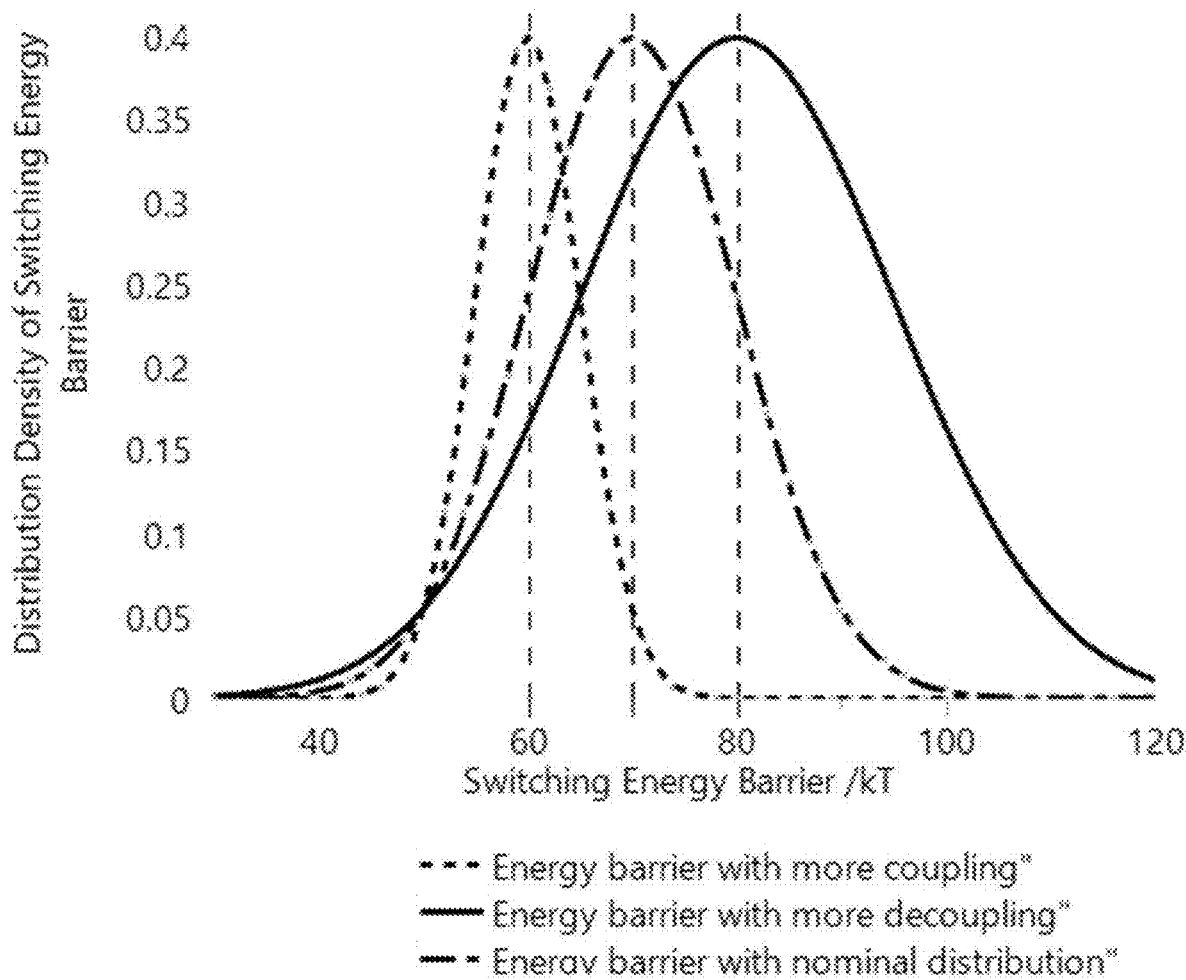
FIG. 5 is a graph of distribution density of switching energy as a function of switching energy barrier for an illustrative exchange-coupled composite.

Given a small volume of grains in an illustrative granular layer 24 such as, for example, about 5 nm to about 10 nm grain size and about 1 nm to about 5 nm height, the anisotropy Ku may be considerably high. As described herein, the grains of the granular layer 24 may include (e.g., be formed of), among other materials, cobalt platinum, iron platinum, and iron palladium, each of which may have strong perpendicular anisotropy Ku. Further, such "hard" magnetic grains (e.g., having Ku values that are higher than typical ferromagnetic alloys used MRAM, the grains are thermally stable at room temperature with the size of about 7 nm to about 10 nm) may have large switching field or switching current due to the large switching energy. The exchange coupling provided between the continuous layer 22 and granular layer 24 may lower the switching field/switching energy barrier and decrease the switching energy barrier distribution simultaneously as shown in FIGS. 4-5. In particular, as shown in the graph of switching probability versus current density for an illustrative exchange coupled composite as shown in FIG. 4, a stronger exchange coupling tend to lower the overall energy barrier and thus lower the critical switching current or field. Further, as shown in the graph of distribution density of switching energy as a function of switching energy barrier for an illustrative exchange-coupled composite in FIG. 5, both center line (mean) and linewidth (sigma) of the energy barrier distribution are tuned down in presence of the exchange coupling.

Figure 6A:
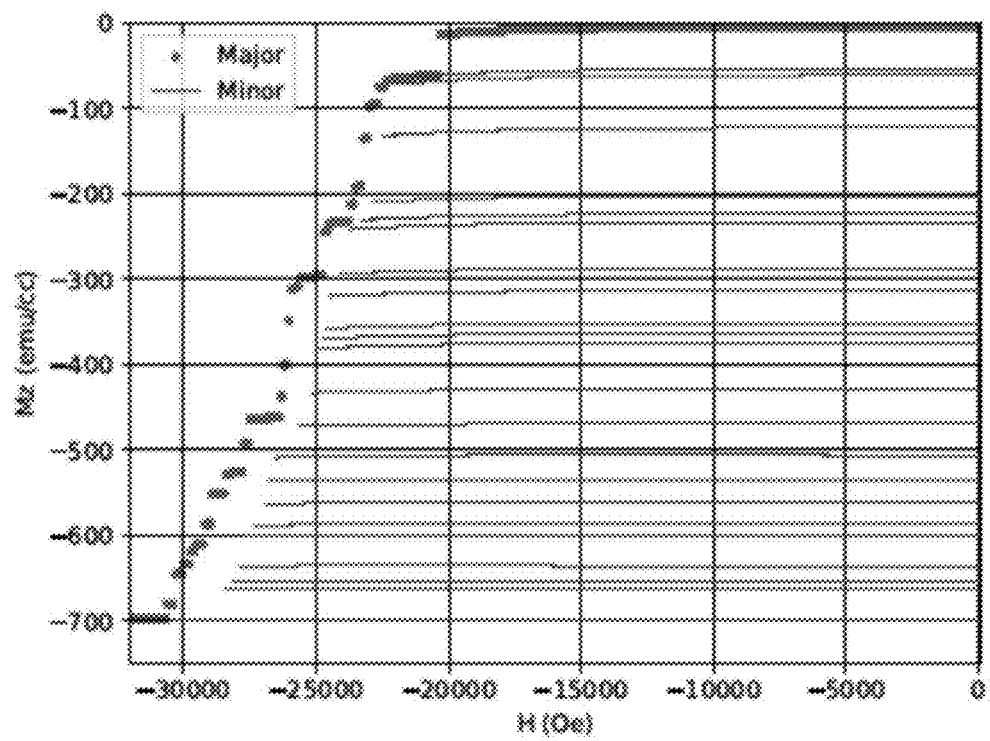
FIG. 6A is a graph of magnetization as a function of magnetic field for an illustrative non-exchange-coupled composite.

Micromagnetic modeling that multi-level STT switching can be realized in such illustrative ECC portions 20 (continuous/granular composite free layer). Further, the assistance of the exchange coupling in such ECC portions, or structures, 20 can efficiently lower the critical switching fields of all the analog states, and therefore, lower the power consumption, while the multi-level magneto-resistive states still hold differentiable as is shown in FIG. 6A. In spin torque driven switching, as shown in FIG. 6B, the switching current can be formalized as effective switching fields in the modeling and similar plots versus current as the horizontal axis can be generated.

Figure 6B:
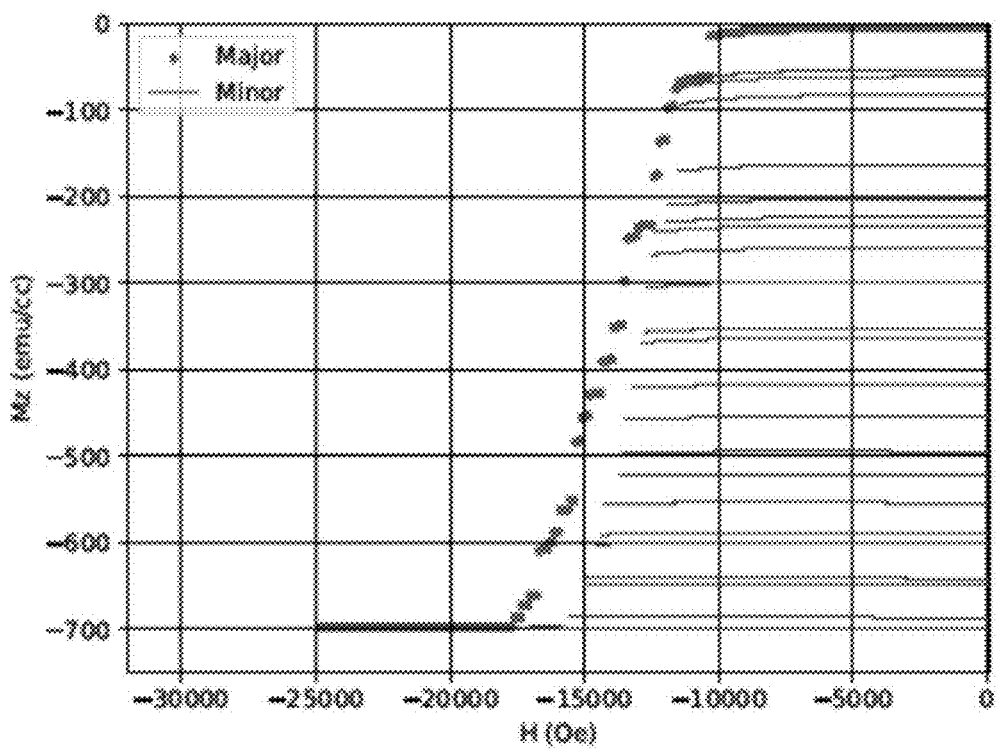
FIG. 6B is a graph of magnetization as a function of magnetic field for an illustrative exchange-coupled composite.

As shown in FIGS. 6A-6B, magnetic major loops (depicted as dots) and magnetic minor loops (depicted as lines red) obtained from micromagnetic modeling of an ensemble of magnetic grains with a distribution of switching energy barrier are shown. The field magnitude on the x-axis can be roughly converted to the critical current following the expression:

$$J_{c0} = \frac{1}{\eta} \frac{2\alpha e}{\hbar} M_s t H_K,$$

where η, e, α, and ℏ, are spin torque efficiency, electron charge, Gilbert damping constant and reduced Planck constant, respectively. t is the effective free-layer thickness. $M_s$ and $H_K$ are saturation magnetization and anisotropy field for the effective free-layer.

Magnetic amplitude testing was completed on a sample with the illustrative ECC portion using a spin-stand tester to, for example, demonstrate multi-level switching. The testing was completed in the manner of one write followed by multiple erases and reads. More specifically, single tone bits with bit length of 50 nm were written by the recording head field on the granular composite media, or ECC portion, in spin-stand tester setup. After writing, the magnetic pattern on the media's written region will be alternating ups and downs with bit length of 50 nm. Then, a DC erase current is applied to the head writer with incremental magnitude (e.g., the writer's erase field strength increases with the DC erase current). The writer will traverse the written region with the applied DC erase current, and the magnetic signal is read back after each step of DC erase current increase. Due to the presence of switching field distribution among the grains of the granular layer, the magnetic moments from individual grains will be flipped at different magnetic field strength, corresponding to a multi-level gradual change of total magnetic signal with the increasing DC erase current. Since the spin-stand read back is already sensing the remnant portion of the magnetization in the bit region, the current observation of the sloped or plateaued signal change as a function of DC erase current is already a demonstration of both non-volatility and controllable analog states.

Figure 7A:
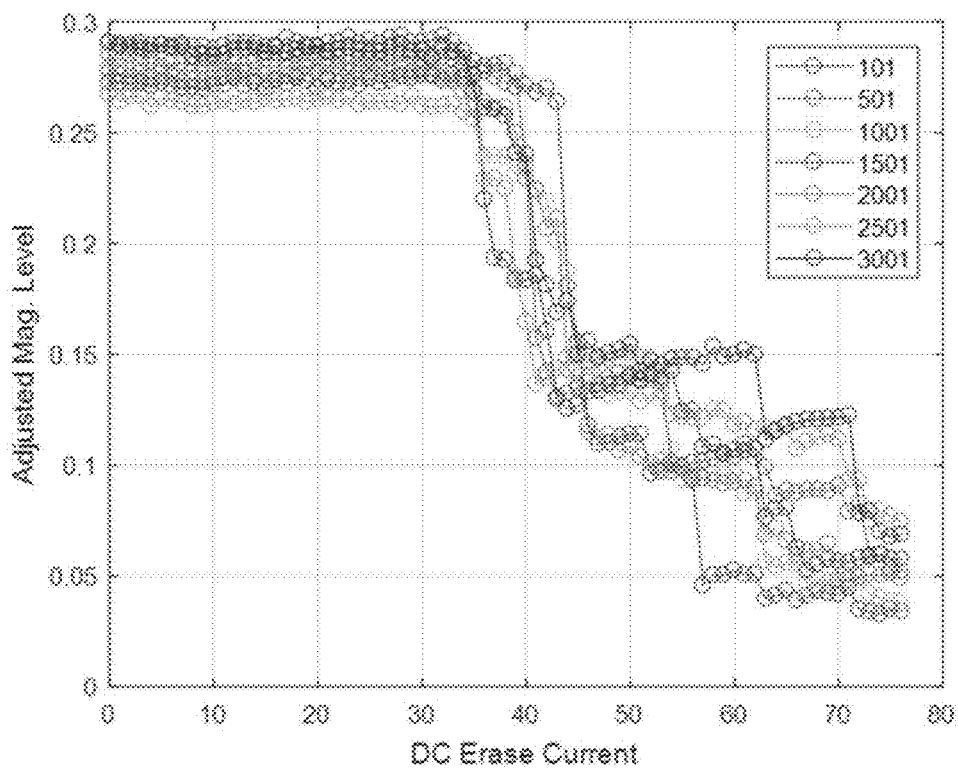
FIG. 7A is a graph of adjusted magnetization level as a function of DC erase current for an illustrative exchange-coupled composite.
Figure 7B:
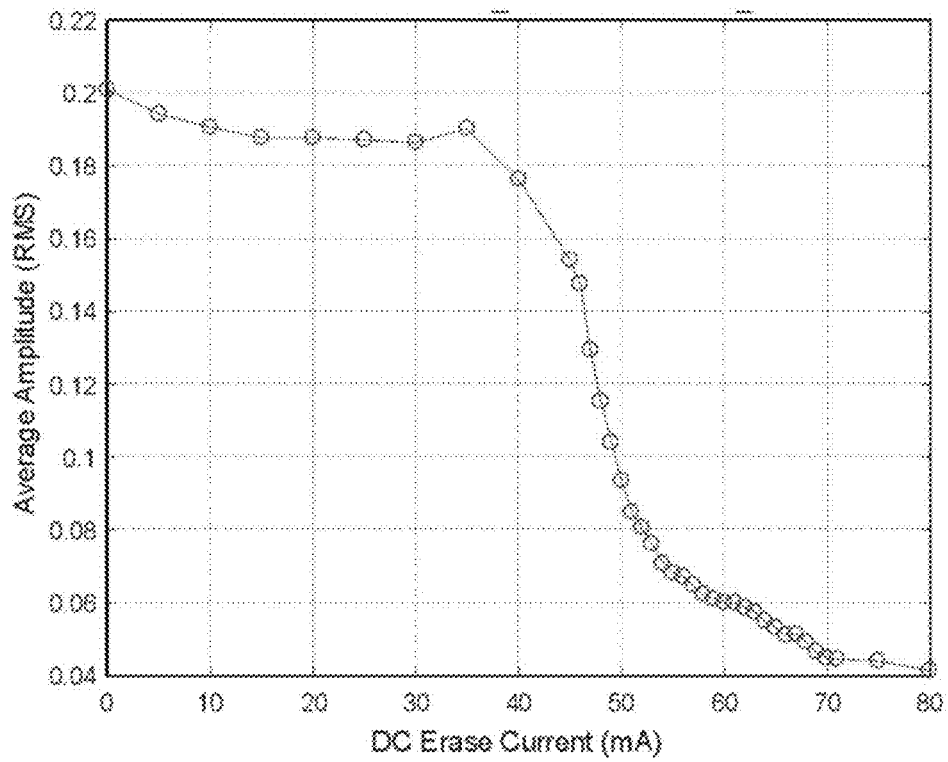
FIG. 7B is a graph of average amplitude of a magnetic signal as a function of DC erase current for an illustrative exchange-coupled composite.

Magnetic signal from a few written bit cells as a function of the applied DC erase current in depicted in FIGS. 7A-7B. The bits were written on the media with structure consisting of a layer of continuous film based on cobalt platinum chromium (CoPtCr) and a layer of granular composite made from cobalt platinum chromium (CoPtCr) with oxides. FIG. 7A shows a few individual bits' signal as the writer erase field ramps up, and FIG. 7B shows the averaged behavior of magnetic signal as a function of erased current. The sloped decrease instead of a sharp step-function switching proves the concept of multi-level memory cell. For example, as shown in FIG. 7A, the data points of various colors are extracted from different bits, demonstrating that the multiple-level switching phenomena are reproducible in all different bits. The gradual change of signal magnitude averaged over 3000 bit cells as shown in FIG. 7B as a function of erase current further illustrated that the multi-level memory concept is feasible and robust.

Figure 8:
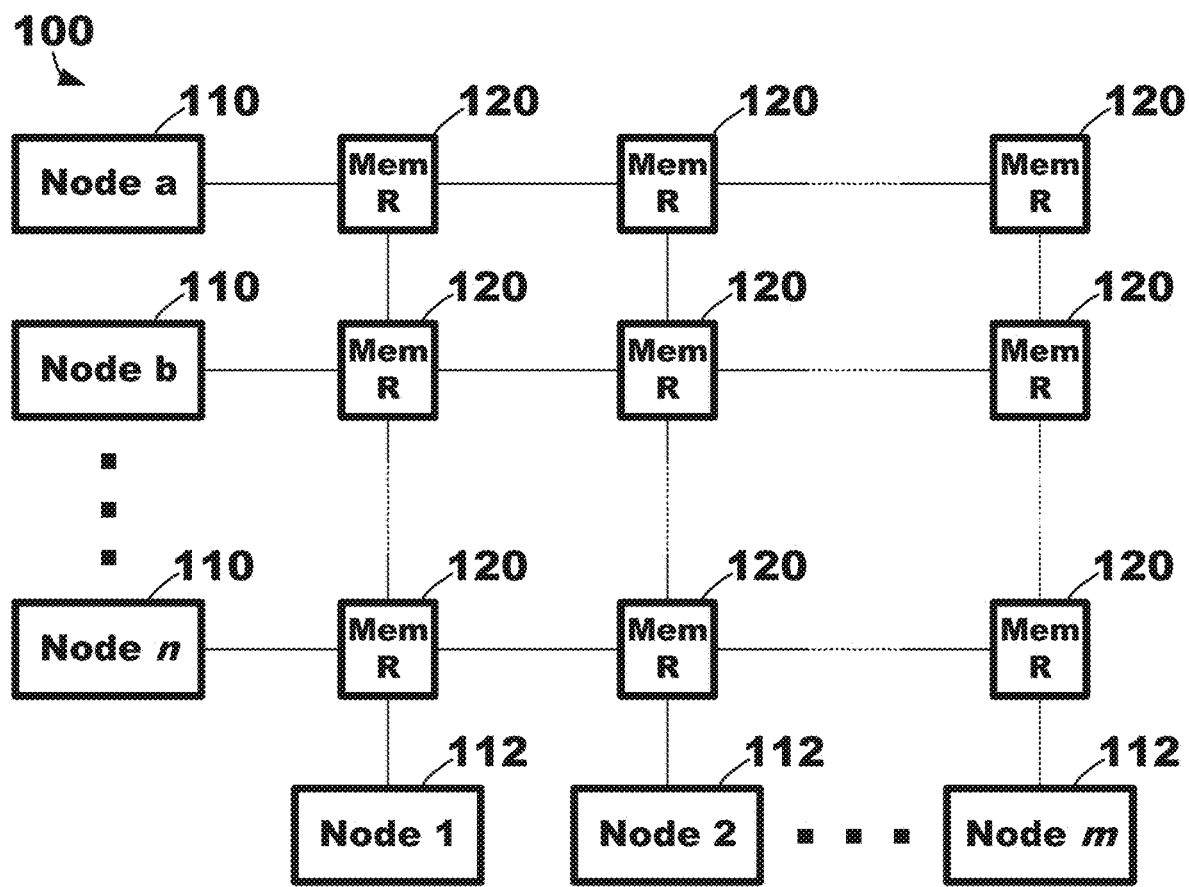
FIG. 8 is diagram of an illustrative system utilizing the illustrative memristor devices described herein.

An illustrative system 100 utilizing the illustrative memristor devices 120 is depicted in FIG. 8. As shown the system 100 includes a plurality of nodes 110, 112, operably coupled to each other about an array of a plurality of memristor devices 120. The system 100 may define, or form, a neural network where the nodes 110, 112 represent the "neurons," and the memristor devices 120 represent the "synapses." Further, the system 100 may define a memory structure for storing data, e.g., a data array.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the disclosure, will be apparent upon reference to this description.

What is claimed:

1. A memristor comprising:
   a magnetically-fixed portion; and
   an exchange-coupled composite (ECC) portion to provide three or more nonvolatile magneto-resistive states, the ECC portion comprising:
   a continuous layer;
   a granular layer magnetically exchange coupled to the continuous layer; and
   an exchange control layer between the continuous layer and the granular layer, wherein the exchange control layer comprises one or more of cobalt ruthenium, cobalt, and platinum, and ruthenium.

2. The memristor of claim 1, wherein a distribution of switching energy barrier in the granular layer provides the three or more nonvolatile magneto resistive states.

3. The memristor of claim 1, wherein the granular layer comprises metallic ferromagnetic grains segregated by nonmagnetic oxides.

4. The memristor of claim 3, wherein the metallic ferromagnetic grains define a diameter between 5 nanometers (nm) and 10 nm.

5. The memristor of claim 1, wherein the granular layer defines a thickness between 1 nm and 8 nm.

6. The memristor of claim 1, wherein the granular layer comprises one or more of cobalt platinum, iron platinum, and iron palladium.

7. The memristor of claim 1, wherein the granular layer defines an anisotropy between 0.5 Merg/cc and 10 Merg/cc, and wherein the granular layer defines a magnetic saturation moment between 500 emu/cc and 2000 emu/cc.

8. The memristor of claim 1 further comprising:
   an insulating layer between the magnetically-fixed portion and the ECC portion;
   a first electrode electrically coupled to the magnetically-fixed portion; and
   a second electrode electrically coupled to the granular layer.

9. The system of claim 1, wherein magnetization directions of the ECC portion is perpendicular to the continuous and granular layers.

10. A device comprising
    a continuous layer;
    a granular layer magnetically exchange coupled to the continuous layer, wherein a distribution of switching energy barrier in the granular layer provides three or more nonvolatile magneto resistive states when used in conjunction with a magnetically-fixed portion; and
    an exchange control layer between the continuous layer and the granular layer, wherein the exchange control layer comprises one or more of cobalt ruthenium, cobalt, and ruthenium.

11. The device of claim 10, wherein the granular layer comprises metallic ferromagnetic grains segregated by nonmagnetic oxides.

12. The device of claim 11, wherein the metallic ferromagnetic grains define a diameter between 5 nm and 10 nm.

13. The device of claim 10, wherein the granular layer defines a thickness between 1 nm and 8 nm.

14. The device of claim 10, wherein the granular layer comprises one or more of cobalt platinum, iron platinum, and iron palladium.

15. The device of claim 10, wherein the granular layer defines an anisotropy between 0.5 Merg/cc and 10 Merg/cc, and wherein the granular layer defines a magnetic saturation moment between 500 emu/cc and 2000 emu/cc.

16. The device of claim 10, wherein magnetization directions of the continuous and granular layers is perpendicular to the continuous and granular layers.

\* \* \* \* \*